United States Patent
Chang et al.

(10) Patent No.: US 9,396,936 B2
(45) Date of Patent: Jul. 19, 2016

(54) METHOD FOR GROWING ALUMINUM INDIUM NITRIDE FILMS ON SILICON SUBSTRATE

(71) Applicant: National Chiao Tung University, Hsinchu (TW)

(72) Inventors: Li Chang, Hsinchu (TW); Jr-Yu Chen, Hsinchu (TW); Wei-Chun Chen, Hsinchu (TW); Pei-Yin Lin, Hsinchu (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 14/304,416

(22) Filed: Jun. 13, 2014

(65) Prior Publication Data

US 2015/0235837 A1    Aug. 20, 2015

(30) Foreign Application Priority Data

Feb. 14, 2014   (TW) .............................. 103104872 A

(51) Int. Cl.
  *H01L 21/02*   (2006.01)
  *H01L 29/04*   (2006.01)
  *H01L 29/20*   (2006.01)

(52) U.S. Cl.
  CPC ........ *H01L 21/0254* (2013.01); *H01L 21/0262* (2013.01); *H01L 21/02381* (2013.01); *H01L 21/02433* (2013.01); *H01L 21/02661* (2013.01); *H01L 29/2003* (2013.01)

(58) Field of Classification Search
  CPC ..................... H01L 29/2003; H01L 21/02458; H01L 21/0262; H01L 21/02433; H01L 21/0254; H01L 21/02631; H01L 21/02507; H01L 21/02499; H01L 21/0237
  USPC ......................................................... 438/478
  See application file for complete search history.

(56) References Cited

U.S. PATENT DOCUMENTS

| 2010/0055883 A1* | 3/2010 | Choi ..................... H01L 33/007 438/481 |
| 2012/0199952 A1* | 8/2012 | D'Evelyn et al. ............. 257/615 |

FOREIGN PATENT DOCUMENTS

| CN | 101901752 A | 12/2010 |
| CN | 102479683 A | 5/2012 |
| TW | 201133938 A1 | 10/2011 |

* cited by examiner

*Primary Examiner* — Evan Pert
*Assistant Examiner* — Changhyun Yi
(74) *Attorney, Agent, or Firm* — Muncy, Geissler, Olds & Lowe, P.C.

(57) ABSTRACT

A method for growing aluminum indium nitride (AlInN) films on silicon substrates comprises several steps: firstly, arranging a silicon substrate in a reaction chamber; secondly, providing multiple reaction gases in the reaction chamber, wherein the reaction gases include aluminum precursors, indium precursors and nitrogen-containing gases; finally, dynamically adjusting flow rates of the reaction gases and directly growing an AlInN layer on the silicon substrate via a crystal growth process. By directly forming an AlInN layer on the silicon substrate, lattice matching is increased, residual thermal stress is reduced and film quality is improved. In addition, fabrication process is simplified and thus cost is reduced.

7 Claims, 4 Drawing Sheets

METHOD FOR GROWING ALUMINUM INDIUM NITRIDE FILMS ON SILICON SUBSTRATE

BACKGROUND OF THE INVENTION

1. Field of the Invention

The present invention relates to a film growing method, particularly to a method for growing aluminum indium nitride films.

2. Description of the Prior Art

Aluminum indium nitride (AlInN or InAlN) is an intrinsic n-type semiconductor. The energy band gap can be varied from 0.7 eV to 6.2 eV with its chemical composition. Since the energy gap covers a large range, it may be applied to high power and high frequency devices, light emitting diodes (LEDs), or full-spectrum solar cells. Regarding Al-rich AlInN, when the In ratio extends to 17-18%, there is no piezoelectric polarization but only spontaneous polarization because the lattice parameter of AlInN completely matches with the lattice parameter of GaN. Thus it is considered as a highly potential semiconductor material for developing high electron mobility transistor (HEMT) and metal-oxide-semiconductor field-effect transistor (MOSFET). Regarding In-rich AlInN, it is highly potential to be applied to solar cells due to its low energy gap and high light-absorbing rate. On the other hand, AlInN may be used with InN or InGaN to form multiple quantum wells (MQWs) structure to be applied to optoelectronic devices.

Although AlInN may be widely used, it is very difficult to be prepared. The difficult part of preparing ternary alloy formed by InN and AlN lies in that growth of AlN has to be performed under a high temperature ranging from 600° C. to 1200° C.; whereas growth of InN should be performed under a temperature lower than 600° C., otherwise InN will be easily to undergo thermal decomposition. Since the difference in preparing temperatures of each preparation is very large, it is difficult to form a ternary alloy simultaneously having both single phase and high quality under a single temperature condition. For example, in order to get AlN, a high temperature process is used when forming Al-rich AlInN, thus resulting in unstable InN and the composition of the ternary group-III nitrides may not be controlled precisely and stably. Therefore epitaxial quality of the film is affected.

Currently, substrates for forming group-III nitrides mainly are silicon substrates, silicon carbide substrates, and sapphire substrates. In which monocrystalline silicon substrates are advantageous in price, size and quality aspects. Many related industries and researchers have developed a few results. However, in order to improve the problem of epitaxial quality degradation caused by lattice mismatching between materials and thermal expansion differences, generally, a buffer layer should be formed on the substrate to grow a high quality nitride film before above three types of substrates being used. For example, before growing group-III nitride films, such as gallium nitride (GaN) or aluminum indium nitride (AlInN), AlN is usually used as a buffer layer. The process makes the preparing method complicated and with a high cost. Besides, AlN brings additional insulating problems to limit developments and popularity of related products.

If AlInN film can be grown without requirement of a buffer layer such that good lattice matching and thermal stability between the substrate and AlInN film are achieved, the usage of AlInN may largely increase.

SUMMARY OF THE INVENTION

This invention provides a method for growing aluminum indium nitride (AlInN) films. By adjusting flow rates of reaction gases, AlInN films can be directly formed on the silicon substrate to get high quality AlInN films. In addition to improving lattice match, reducing residual stress, and avoiding meltback etching, fabrication process is also simplified and cost is reduced.

According to one embodiment of this invention, a method for growing AlInN films comprises several steps: firstly, arranging a silicon substrate in a reaction chamber, wherein a processing temperature of a crystal growth process is 400° C.-700° C.; secondly, providing multiple reaction gases in the reaction chamber, wherein the reaction gases include aluminum precursors, indium precursors and nitrogen-containing gases; finally, dynamically adjusting flow rates of the reaction gases and directly growing an AlInN layer on the silicon substrate via the a crystal growth process, wherein dynamically adjusting flow rate of the reaction gases comprises several steps: firstly, providing the aluminum precursor and the indium precursor by a pulse cycle, and the aluminum precursor and the indium precursor having a flow rate ratio, wherein in the pulse cycle, the flow rate control of the aluminum precursor and the indium precursor are provided and stopped simultaneously and periodically; secondly, providing the nitrogen-containing gas to start the crystal growth process; finally repeating the pulse cycle for at least one time.

The objects, technical features and effects of this invention will be more apparent to those having ordinary skills in the art by following description of embodiments accompanying with drawings.

DESCRIPTION OF THE PREFERRED EMBODIMENT

Figure 1:
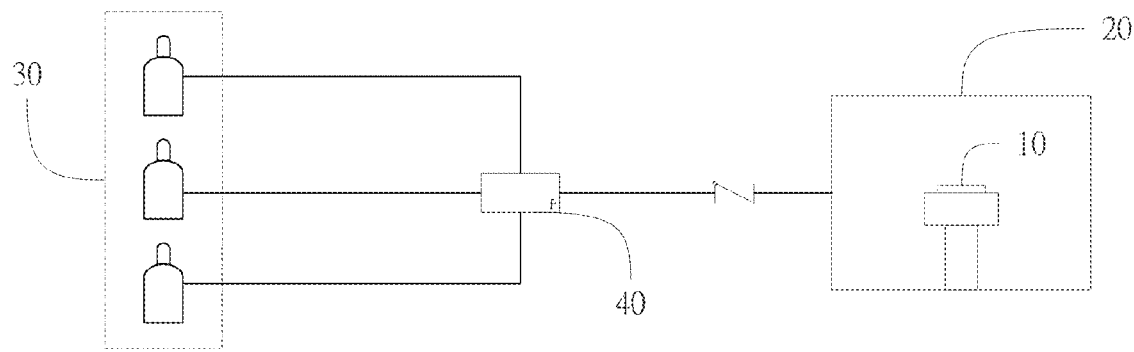
FIG. 1 is an illustrative system diagram of an aluminum indium nitride film growing method of one embodiment of this invention.
Figure 2:
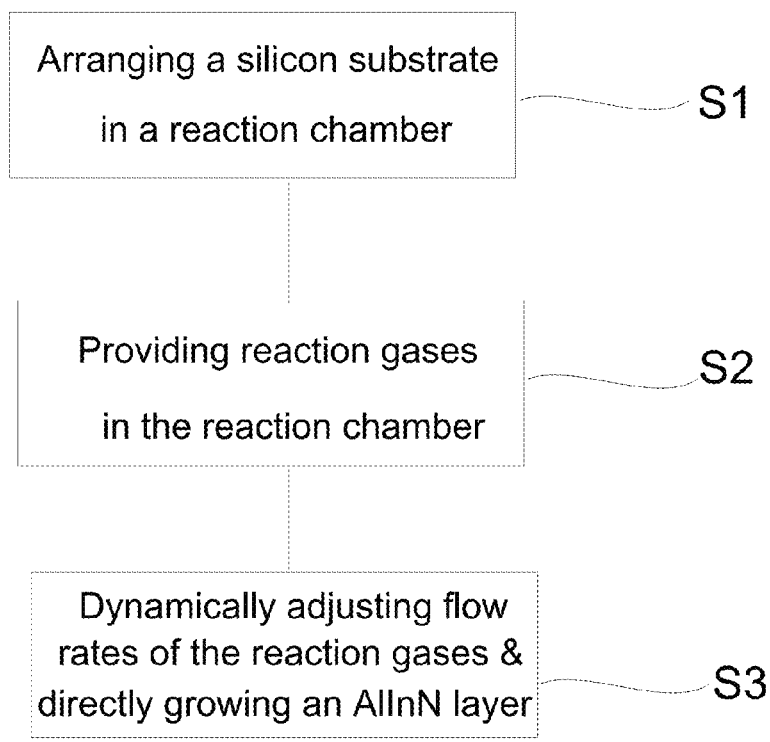
FIG. 2 is a flow diagram of an aluminum indium nitride film growing method of one embodiment of this invention.

Refer to FIG. 1 and FIG. 2, which are illustrative system diagram and flow diagram of an aluminum indium nitride film growing method of one embodiment of this invention, respectively. Firstly, a silicon substrate 10 is arranged in a reaction chamber 20 (step S1). Secondly, multiple reaction gases are provided into the reaction chamber 20 from a gas source 30

Figure 3:
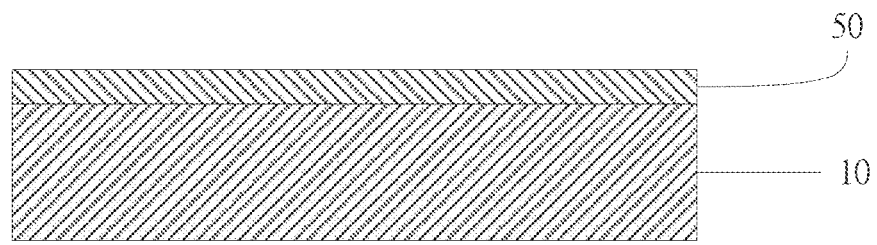
FIG. 3 is an illustrative structure diagram of an aluminum indium nitride film grown on a silicon substrate of one embodiment of this invention.

(step S2), wherein the gas source 30 includes multiple gas bottles. Reaction gases include aluminum precursors, indium precursors and nitrogen-containing gases. During the process, flow rates of multiple reaction gases can be adjusted via a flow rate controller 40 (which includes a host, mass flow meters, etc.) and an AlInN layer may be directly formed on the silicon substrate via a crystal growth process (step S3). The crystal growth process may be an epitaxy process. The grown structure, as shown in FIG. 3, includes the silicon substrate 10 and an AlInN layer 50. There is no buffer layer between the silicon substrate 10 and the AlInN layer 50. The crystal growth process may be metal-organic chemical vapor deposition (MOCVD), metal-organic vapor-phase epitaxy (MOVPE) or molecular beam epitaxy (MBE). In one embodiment, the silicon substrate may be a monocrystalline silicon substrate or a polycrystalline silicon substrate. Moreover, the silicon substrate may be a silicon (100) substrate, a silicon (111) substrate or a silicon (110) substrate. The final AlInN film grown on the silicon substrate 10 is mainly an epitaxial film, but monocrystalline film or polycrystalline film is also possible.

Figure 4:
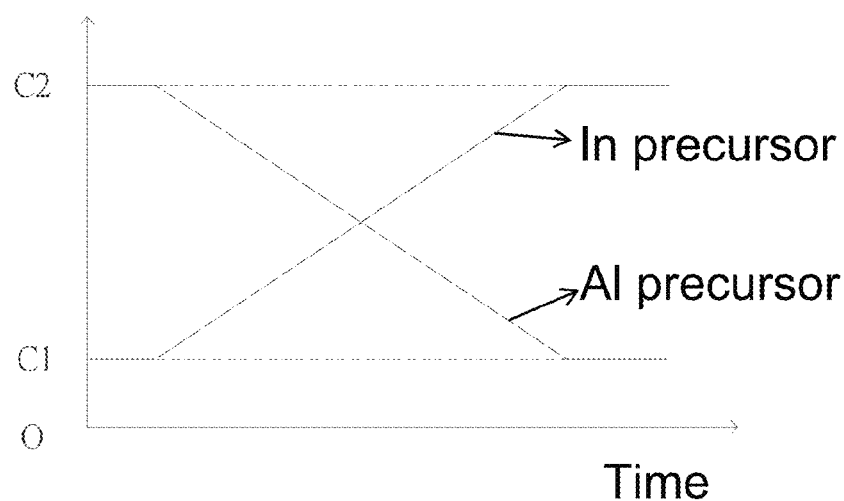
FIG. 4 is an illustrative diagram of dynamically adjusting flow rates of the precursors versus time of one embodiment of this invention.
Figure 5:
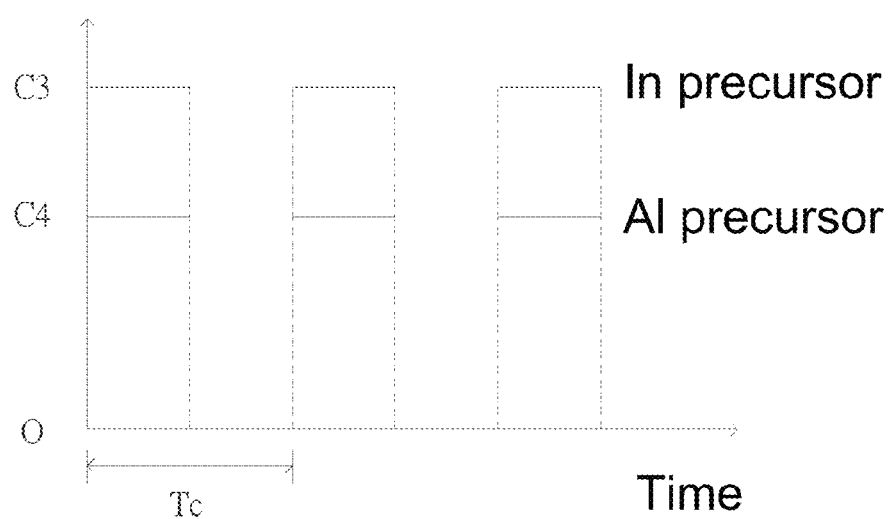
FIG. 5 is an illustrative diagram of dynamically adjusting flow rates of the precursors versus time of another embodiment of this invention.

During process, the methods used for adjusting flow rates of multiple reaction gases mainly are graded flow rate adjusting method and pulse flowing method. The steps of graded flow rate adjusting method are: adjusting the flow rate such that flow rate of the aluminum precursor is higher than that of the indium precursor. Also, the aluminum precursor and the indium precursor sufficiently contact the silicon substrate such that the reaction proceeds evenly. Then nitrogen-containing gas is provided to start the crystal growth process. After the reaction proceeds for a while, the flow rate of the indium precursor is increased gradually. Finally, the flow rate of the indium precursor is higher than that of the aluminum precursor. The reaction continues until the AlInN grows to a desired thickness. During the process, the reaction gas in the reaction chamber is transformed from an Al-rich state to an In-rich state. For example, FIG. 4 is an illustrative diagram of the flow rates of the precursors. The flow rate of the aluminum precursor starts from C2 for a while, and decreased gradually to C1. The flow rate of the indium precursor starts from C1 for a while, and increased gradually to C2. It is noted that FIG. 4 is for illustrative purpose only, and the invention is thus not limited thereto. The increasing or decreasing trend may be linear or non-linear. The starting flow rate and ending flow rate of the precursors can be varied according to different needs and are not limited to C1 and C2. The steps of pulse flowing method includes: providing aluminum precursor and indium precursor by a pulse cycle, wherein in the pulse cycle, the flow rate control of the aluminum precursor and the indium precursor are started and stopped simultaneously. In other words, the aluminum precursor and the indium precursor are provided simultaneously for a while, wherein the aluminum precursor and the indium precursor have a flow rate ratio. Then the aluminum precursor and the indium precursor are stopped simultaneously for a while to produce a cycle. Nitrogen-containing gas is also provided while the precursors are provided to perform a crystal growth step. Above steps are repeated until the film grows to a desired thickness. Refer to FIG. 5 which is an illustrative diagram of the flow rate of the precursors. The starting flow rate of the indium precursor is C3, and the starting flow rate of the aluminum precursor is C4. The flow rate ratio of the precursors is fixed. The gases are provided by a cycle Tc until the film grows to a desired thickness. It is noted that FIG. 5 is for illustrative purpose only, and the invention is not thus limited thereto. The flow rates C3, C4, and the flow rate ratio can be adjusted according to different needs. In one pulse cycle Tc, the gas-providing period and gas-stopping period are not necessarily the same.

According to above dynamic adjusting of the flow rates of the gases, proper gas concentration and reaction position may be achieved. Thus the film may grow under a low temperature condition to avoid formation of amorphous silicon nitride and phase separation of the nitride film. Besides, under a lower temperature, the composition of AlInN and the film structure are stable to improve the quality of the film. In one embodiment, the processing temperature of the crystal growth step is 400° C. to 700° C., which is much lower than traditional processing temperature 900° C. to 1200° C.

There are several advantages of directly growing AlInN film on the silicon substrate according to the invention. First, the AlInN films are directly grown without additional buffer layers (such as AlN and GaN), thus complicated process is simplified and cost is reduced. Structural defects between the buffer layers and the AlInN are also avoided. Also, AlN is highly insulating, so electrical designs are widely applied by omitting AlN buffer layers.

In addition, compared with AlN used as the buffer layer, direct growth of AlInN may improve lattice matching between AlInN and the silicon substrate. For example, the commonly used Si(111) substrate has a lattice parameter of 0.384 nm in <110>, while the a-axis lattice parameter of AlN having a wurtzite structure is 0.312 nm, which has a high lattice mismatch of 23.5% with Si(111). The a-axis lattice parameter of InN is 0.3538 nm, which is closer to that of Si(111). If the AlN buffer layer is omitted and ternary AlInN layer is directly formed, the lattice match between the AlInN layer and the Si(111) substrate will be better.

Besides, the AlInN film growing method of this invention may further reduce residual thermal stress. So-called thermal stress is a stress concentrating phenomena that appears when the temperature is increasing or decreasing. Due to different expansion coefficients of the substrate material and the film material, stress will concentrate according to different expansion extent. If the residual thermal stress is too large, the film will break, separate, or warp. The thermal expansion coefficient difference between AlN, GaN and the silicon substrate is larger, while the thermal expansion coefficient difference between InN and the silicon substrate is less. If AlN and InN constitute a ternary alloy to directly grow the AlInN film, residual thermal stress will be reduced and a thicker and higher quality film will be obtained.

Meltback etching is also a frequently encountered problem when growing the film. According to the phase equilibrium diagram, the eutectic temperatures of Si—Ga, Si—In, and Si—Al are 29.8° C., 157° C. and 557° C., respectively. Aluminum and silicon have a higher eutectic temperature while gallium, indium and silicon have a lower eutectic temperature. Thus when growing gallium-containing nitride, such as GaN, or indium-containing nitride, such as InN, meltback etching with silicon appears easily to affect stability of the film structure and composition. If Al is properly added to constitute a ternary alloy, such as AlInN, the eutectic temperature with silicon will increase. In a preferred embodiment, the eutectic temperature is equal to or higher than 400° C. Thus meltback etching may be avoided and film quality may be further improved.

Precursors are selected from the group consisting of alkyl metallic compounds, organic metallic hydrides or adducts. Aluminum precursor is selected from the group consisting of trimethylaluminum (TMAl), triethylaluminum, tri-n-propylaluminum, tri-n-butylaluminum, tri-iso-butylaluminum, tri-t-butylaluminum and dimethylaluminum hydride. Indium precursor is selected from the group consisting of trimethylindium (TMIn), triethylindium, tri-n-propylindium and tri-i-propylindium. Moreover, the nitrogen-containing gas is selected from the group consisting of ammonia gas ($NH_3$), nitrogen ($N_2$), and group V precursor containing nitrogen.

Several embodiments are provided for illustrating the growing method for aluminum indium nitride film according to this invention. The embodiments are illustrative only, and this invention is not limited thereto.

First Example

Figure 6A:
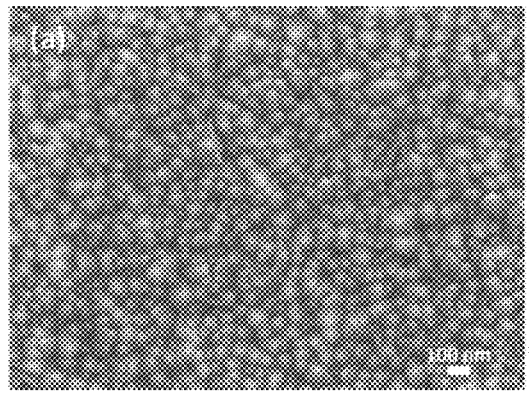
FIGS. 6A and 6B are surface and cross-sectional SEM (scanning electron microscope) micrographs after growing AlInN film according to a first embodiment.
Figure 6B:
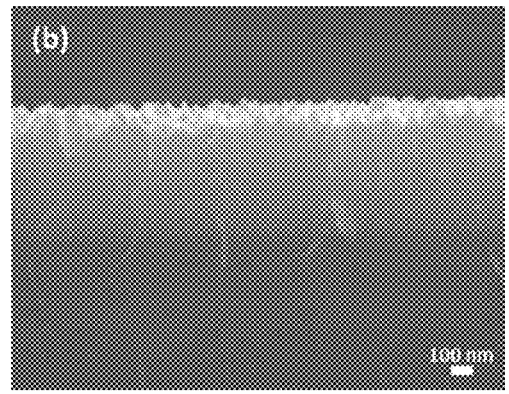
Figure 7A:
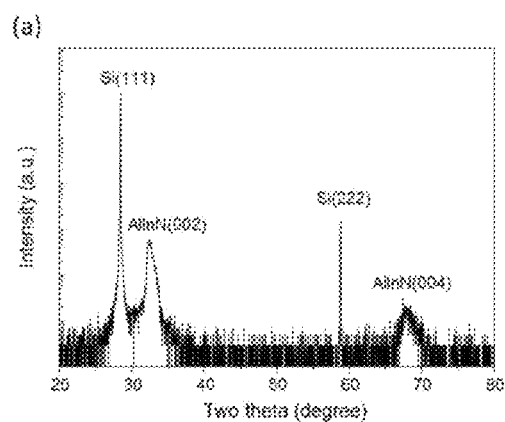
FIGS. 7A and 7B are 2θ-scan and Phi-scan diagrams of AlInN(10-11) after growing AlInN film according to a first embodiment by X-ray diffraction (XRD).
Figure 7B:
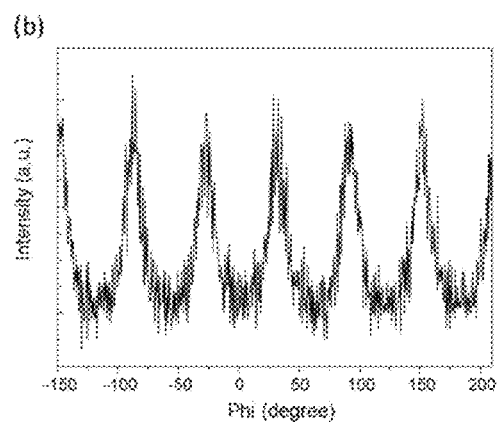

A Si(111) substrate is subjected to wet chemical cleaning by isopropanol, $H_2SO_4/H_2O_2$ solution and DHF to remove contamination and oxidation layer on the substrate. Then the silicon substrate is arranged in the MOCVD reaction chamber. Hydrogen is provided and the silicon substrate is subjected to a thermal process at around 1000° C. After the temperature is decreased to 500° C. and the temperature and the pressure are balanced, organic metallic precursors containing trimethylaluminium (TMAl) and trimethylindium (TMIn) are provided into the chamber simultaneously according to a flow rate ratio of 10:1 by using hydrogen as a carrier gas. After seconds, when the surface of silicon substrate fully absorbs TMAl and TMIn, $NH_3$ is provided under the same temperature and pressure to grow AlInN film. Afterwards, the flow rate of TMIn increases gradually such that the final flow rate ratio of TMAl and TMIn is 1:10. FIGS. 6A and 6B are surface and cross-sectional SEM micrographs after growing AlInN film. The thickness of AlInN film is about 600 nm. No intermediate reaction layer or melting reaction among Al, In and Si occurs. 2θ-scan and Phi-scan diagrams of AlInN (10-11) after growing AlInN film by X-ray diffraction (XRD) are shown in FIGS. 7A and 7B, respectively. The AlInN film has a single phase structure with six-fold symmetry (no peak signals of MN and InN). The In content is about 74% in the film. The AlInN film is grown on the Si(111) substrate by epitaxy with an AlInN(0001)/Si(111) and AlInN<11-20>/Si<110> relationship. As such, the method can grow an AlInN film on a silicon substrate efficiently by epitaxy.

Second Example

Figure 8A:
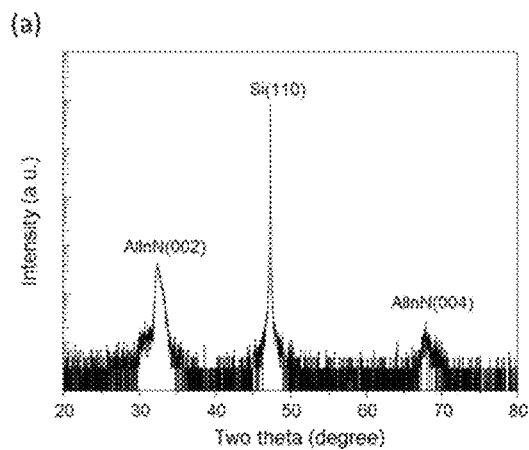
FIGS. 8A and 8B are 2θ-scan and Phi-scan diagrams of AlInN(10-11) after growing AlInN film according to a second embodiment by XRD.
Figure 8B:
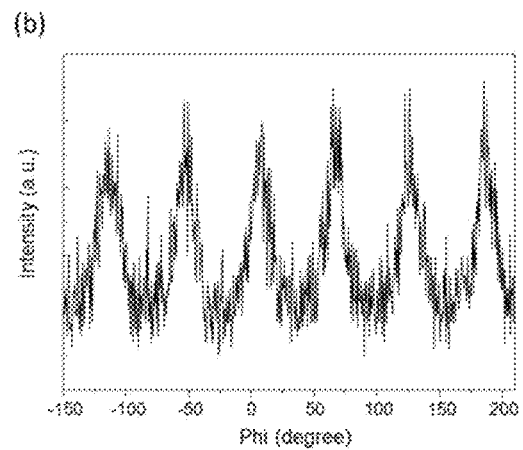

Instead of Si(111) substrate used in the first embodiment, Si(110) substrate is used. The AlInN film is grown by the same method. 2θ-scan and Phi scan diagrams of AlInN(10-11) after growing AlInN film by X-ray diffraction (XRD) are shown in FIGS. 8A and 8B, respectively. The In content is about 76% in the film. Again, the AlInN film has a six-fold symmetrical structure. Therefore AlInN film can also be grown on the Si(110) substrate by epitaxy.

Third Example

Figure 9A:
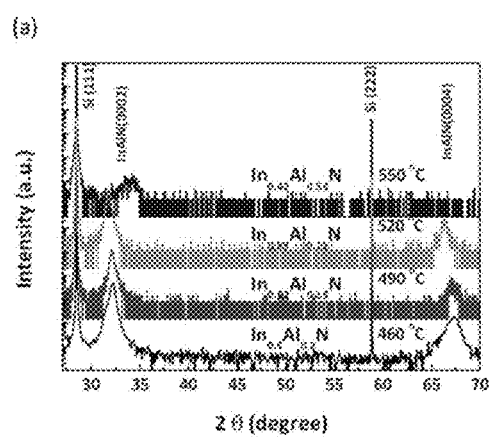
FIGS. 9A and 9B are 2θ-scan and Phi-scan diagrams of AlInN(10-11) after growing AlInN film according to a third embodiment by XRD.
Figure 9B:
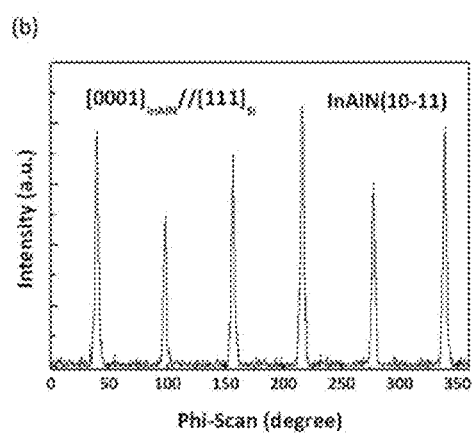

Si(111) substrate is subjected to the same wet chemical cleaning as the first embodiment to be preprocessed. Then it is arranged in a radio frequency plasma-assisted metal-organic molecular beam epitaxy (RF-MOMBE) system to undergo a thermal process at 900° C. to remove oxidation layer on the surface of the substrate. The RF-MOMBE system excites provided nitrogen by RF (13.56 MHz) to produce plasma as a reaction source of nitrogen. The group III precursors of TMAl and TMIn are used for Al and In reaction sources, respectively. In this embodiment, the power is 300 W, flow rate of nitrogen is 1 sccm, working pressure <$1.2 \times 10^{-5}$ Torr, the flow rate ratio of TMIn/TMAl is a constant of 3.3. AlInN films are grown between 460° C.-550° C. by epitaxy. During the low temperature growing, TMIn and TMAl precursors are provided by a pulse cycle with providing precursors for 10 seconds and stop providing for 10 seconds in a cycle. 360 cycles are repeated. From 2θ-scan and Phi-scan diagrams of AlInN (10-11) by X-ray diffraction (XRD) as shown in FIGS. 9A and 9B, respectively, by using the pulse cycle of the group III precursors in the RF-MOMBE system, AlInN film can be grown on Si (111) substrate by epitaxy. The In contents of the films are 80-89%.

To sum up, this invention provides a method for growing AlInN film. By dynamically adjusting flow rates of reaction gases, an AlInN film with high quality can grow on a silicon substrate directly. In addition to increasing lattice matching, residual thermal stress is reduced and meltback etching is avoided. Further, fabrication process is simplified and thus cost is reduced.

What is claimed is:

1. A method for growing aluminum indium nitride (AlInN) film, comprising:
    arranging a silicon substrate in a reaction chamber, wherein a processing temperature of a crystal growth process is 400° C.-700° C.;
    providing a plurality of reaction gases in the reaction chamber, wherein the reaction gases include aluminum precursor, indium precursor and nitrogen-containing gases;
    dynamically adjusting flow rates of the reaction gases and directly growing an AlInN layer on the silicon substrate via the crystal growth process, wherein dynamically adjusting flow rate of the reaction gases comprises:
        providing the aluminum precursor and the indium precursor by a pulse cycle, and the aluminum precursor and the indium precursor having a flow rate ratio, wherein in the pulse cycle, the flow rate control of the aluminum precursor and the indium precursor are provided and stopped simultaneously and periodically;
        providing the nitrogen-containing gas to start the crystal growth process; and
        repeating the pulse cycle for at least one time.

2. The method according to claim 1, wherein the crystal growth process is metal-organic chemical vapor deposition (MOCVD), metal-organic vapor-phase epitaxy (MOVPE) or molecular beam epitaxy (MBE).

3. The method according to claim 1, wherein the silicon substrate is a monocrystalline silicon substrate or a polycrystalline silicon substrate.

4. The method according to claim 1, wherein the silicon substrate is a silicon (111) substrate, a silicon (100) substrate or a silicon (110) substrate.

5. The method according to claim 1, wherein the aluminum precursor is selected from the group consisting of trimethylaluminum, triethylaluminum, tri-n-propylaluminum, tri-n-butylaluminum, tri-iso-butylaluminum, tri-t-butylaluminum, and dimethylaluminum hydride.

6. The method according to claim 1, wherein the indium precursor is selected from the group consisting of trimethylindium, triethylindium, tri-n-propylindium, and tri-i-propylindium.

7. The method according to claim 1, wherein the nitrogen-containing gas is selected from the group consisting of ammonia gas, nitrogen, and group V precursor containing nitrogen.

* * * * *